(12) United States Patent
McLaughlin et al.

(10) Patent No.: US 6,995,392 B2
(45) Date of Patent: Feb. 7, 2006

(54) TEST STRUCTURE FOR LOCATING ELECTROMIGRATION VOIDS IN DUAL DAMASCENE INTERCONNECTS

(75) Inventors: Paul S. McLaughlin, Poughkeepsie, NY (US); Timothy D. Sullivan, Underhill, VT (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 10/214,546

(22) Filed: Aug. 7, 2002

(65) Prior Publication Data

US 2004/0026693 A1    Feb. 12, 2004

(51) Int. Cl.
*H01L 23/58* (2006.01)
(52) U.S. Cl. ...................................................... 257/48
(58) Field of Classification Search ................ 257/760, 257/758, 750, 773, 774, 48; 438/687, 675, 438/652, 468
See application file for complete search history.

(56) References Cited

U.S. PATENT DOCUMENTS

| | | | |
|---|---|---|---|
| 5,057,441 A | 10/1991 | Gutt et al. ...................... 437/8 |
| 5,510,293 A | 4/1996 | Numata ...................... 437/195 |
| 5,519,250 A | 5/1996 | Numata ...................... 257/632 |
| 5,625,232 A | 4/1997 | Numata ...................... 257/758 |
| 5,675,187 A | 10/1997 | Numata et al. .............. 257/758 |
| 5,751,056 A | 5/1998 | Numata ...................... 257/666 |
| 5,777,486 A * | 7/1998 | Hsu ........................... 324/763 |
| 5,814,560 A | 9/1998 | Cheung et al. ............. 438/648 |
| 5,874,777 A | 2/1999 | Ohmi et al. ................ 257/758 |
| 5,880,018 A | 3/1999 | Boeck et al. ............... 438/619 |
| 6,034,420 A | 3/2000 | Tran ........................... 257/644 |
| 6,051,491 A | 4/2000 | Ito ............................. 438/619 |
| 6,072,945 A * | 6/2000 | Aji ........................ 395/500.06 |
| 6,083,850 A | 7/2000 | Shields ...................... 438/763 |
| 6,090,698 A | 7/2000 | Lee ............................. 438/619 |
| 6,124,198 A | 9/2000 | Moslehi ..................... 438/622 |
| 6,146,985 A | 11/2000 | Wollesen ................... 438/618 |
| 6,159,756 A | 12/2000 | Yamada ...................... 438/14 |
| 6,288,556 B1 | 9/2001 | Sato et al. .................. 324/715 |

FOREIGN PATENT DOCUMENTS

WO    WO 99/54934    10/1999

OTHER PUBLICATIONS

Bin Zhao, "Advanced Interconnect Systems for ULSI Technology," Proc. 5th International Conf. on Solid State & IC Technology, (1998), pp. 87-89.*

* cited by examiner

*Primary Examiner*—Douglas W Owens
(74) *Attorney, Agent, or Firm*—Lisa U. Jaklitsch; Cantor Colburn LLP

(57) ABSTRACT

A test structure is disclosed for locating electromigration voids in a semiconductor interconnect structure having an interconnect via interconnecting a lower metallization line with an upper metallization line. In an exemplary embodiment, the test structure includes a via portion the top of the interconnect via at the upper metallization line. In addition, a line portion extends from the via portion, wherein the line portion connects to an external probing surface, in addition to a probing surface on the lower metallization line, thereby allowing the identification of any electromigration voids present in the interconnect via.

11 Claims, 3 Drawing Sheets

TEST STRUCTURE FOR LOCATING ELECTROMIGRATION VOIDS IN DUAL DAMASCENE INTERCONNECTS

BACKGROUND

The present invention relates generally to the manufacture of integrated circuit devices and, more particularly, to a test structure for locating electromigration voids in dual damascene interconnects.

Integrated circuits are typically fabricated with multiple levels of patterned metallization lines, electrically separated from one another by interlayer dielectrics containing vias at selected locations to provide electrical connections between levels of the patterned metallization lines. As these integrated circuits are scaled to smaller dimensions in a continual effort to provide increased density and performance (e.g., by increasing device speed and providing greater circuit functionality within a given area chip), the interconnect linewidth dimension becomes increasingly narrow, which in turn renders them more susceptible to deleterious effects such as electromigration.

Electromigration is a term referring to the phenomenon of mass transport of metallic atoms (e.g., copper or aluminum) which make up the interconnect material, as a result of electrical current conduction therethrough. More specifically, the electron current collides with the metal ions, thereby pushing them in the direction of current travel. Over an extended period of time, the vacated atoms tend to cause void formations typically at one end of a line, whereas the accumulation of atoms at the other end of the line tend to cause hillock formations. Such deformation degrades line resistance and, in some instances, leads to open circuits, short circuits and device failure. This phenomenon becomes increasingly more significant in integrated circuit design, as relative current densities through metallization lines continue to increase as the linewidth dimensions shrink.

In dual damascene interconnects, electromigration-induced voiding may occur in either the via portion or the line portion of the dual damascene structure. However, the root cause(s) of the electromigration voiding may differ, depending upon the specific location of the void. For example, a void located near the bottom of a via usually indicates defects in the via, or perhaps poor coverage of liner material at the bottom of the via. On the other hand, voiding in the line may suggest a problem at the interface between the capping layer and the metallization. As a result, it is desirable to distinguish between the two failure locations in order to identify the root cause of electromigration fails, and to modify the fabrication processes for reliability improvement.

Unfortunately, conventional probing structures presently in existence do not allow for a distinction to be made between the two types of failure mechanisms discussed above, since electromigration tests for a via void and a line void yield the same electrical failure signature. Thus, to correctly determine the void location in a dual damascene structure, a failure analysis of a cross-sectional portion of the structure by scanning electron microscope (SEM) may be necessary. Such an analysis, however, is both costly and time consuming.

BRIEF SUMMARY

The foregoing discussed drawbacks and deficiencies of the prior art are overcome or alleviated by an electromigration test structure with an interconnect via added to the top of the interconnect of interest. In an exemplary embodiment, the test structure includes a via portion on the top of the interconnect via at the upper metallization line. In addition, a line portion extends from the via portion, wherein the line portion connects to an external probing surface, in addition to a probing surface on the lower metallization line, thereby allowing the identification of any electromigration voids present in the interconnect via.

In a preferred embodiment, the semiconductor interconnect structure is a dual damascene structure. The via portion overlaps the interconnect via, wherein the via portion is centered over a top corner of the interconnect via.

BRIEF DESCRIPTION OF THE DRAWINGS

Referring to the exemplary drawings wherein like elements are numbered alike in the several Figures.

DETAILED DESCRIPTION

Figure 1:
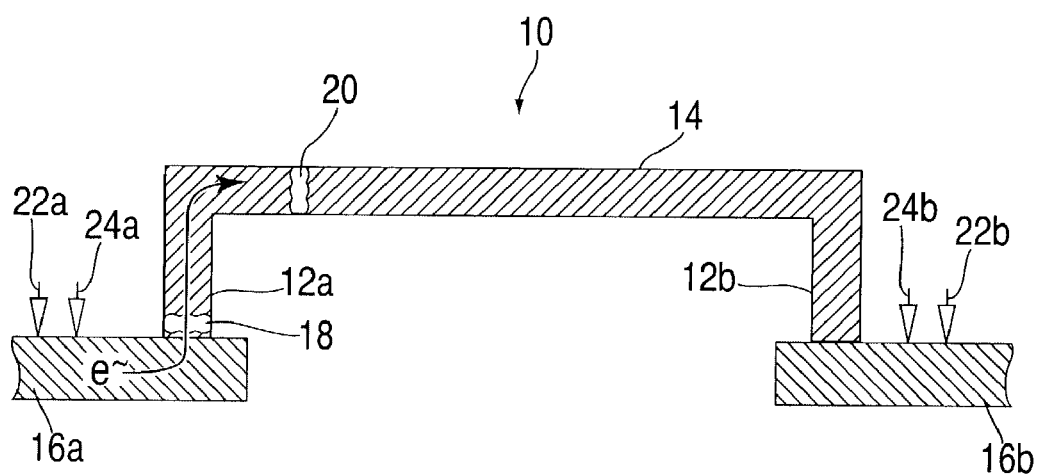
FIG. 1 is a cross-sectional view of a dual damascene structure, wherein a conventional electromigration probe test is performed thereupon.

Referring initially to FIG. 1, there is shown an exemplary dual damascene structure 10, as may be commonly found within an integrated circuit device. The dual damascene structure 10 includes interconnect vias 12a, 12b, that serve to interconnect an upper level metallization line 14 with lower level metallization lines 16a, 16b. For ease of illustration, the interlevel dielectrics that insulate the upper and lower level metallization layers from one another are not shown in the Figures.

As can be seen in FIG. 1, the dual damascene structure 10 has a pair of electromigration induced voids therein, as a result of a generally unidirectional current traveling therethrough (indicated by the e⁻ arrow). A first void 18 (hereinafter referred to as the via void) is formed at the bottom of interconnect via 12a, while a second void 20 (hereinafter referred to as the line void) is formed within upper metallization line 14. In conventional electromigration testing, a technique such as a four-point probe is used to supply a current through the dual damascene structure 10 through a first pair of probes 22a, 22b. A voltmeter is then used to measure the voltage across the structure 10 through a second pair of probes 24a, 24b. Through Ohm's law the resistivity of the structure 10 is determined, thereby determining the presence of electromigration voids.

However, it will be appreciated that when both the force (current) and sense (voltage) lines are wired out across both the interconnect vias 12a, 12b and the metallization line 14, as shown in FIG. 1, it is impossible to distinguish between the via void 18 and the line void 20, since both the voids are located between the voltage and current probes. Therefore, in accordance with an embodiment of the invention, there is disclosed an interconnect structure that provides an additional wireout location upon which to apply probes for electromigration testing. In this manner, both the vias and the metallization lines in a dual damascene structure may be tested independently to localize any voids discovered therein.

Figure 2:
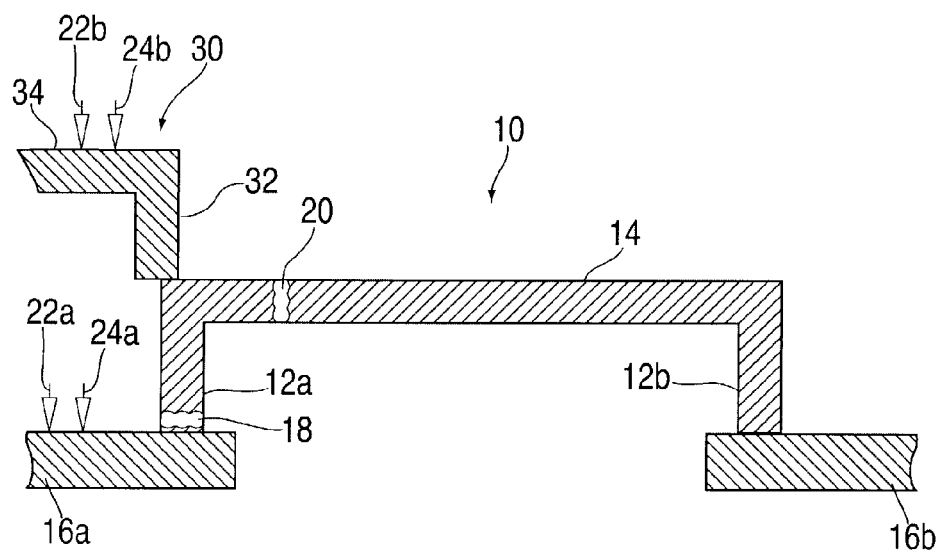
FIG. 2 is a cross-sectional view of an interconnect structure used for locating electromigration voids in dual damascene structures, in accordance with an embodiment of the invention.

Referring now to FIG. 2, there is a shown a cross-sectional view of the dual damascene structure of FIG. 1, this time with the addition of an interconnect test structure 30. The interconnect test structure 30 includes a via portion 32 disposed above interconnect via 12a, and is maintained in direct (and electrical) contact with a portion of the upper metallization line 34 overlying the top of interconnect via 12a. Interconnect test structure 30 also includes a line portion 34, extending from the via portion 32.

Figure 3:
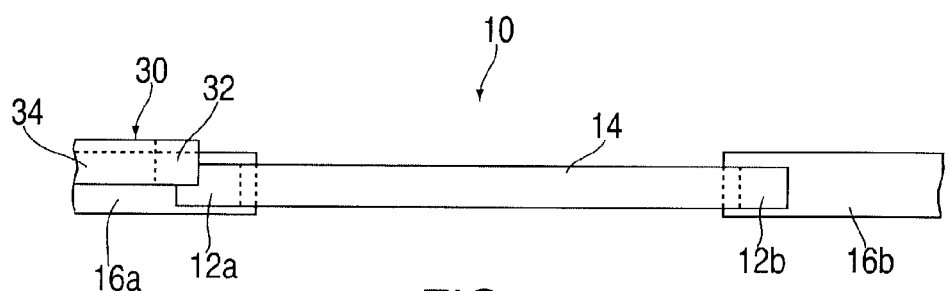
FIG. 3 is a top view of the interconnect structure shown in FIG. 2.

As shown in the top view of FIG. 3, the via portion 32 of interconnect test structure 30 is oriented in an overlapping configuration with respect to interconnect via 12a. More specifically, the center of via portion 32 is aligned over one of the corners of interconnect via 12a. In so doing, several advantages are realized. First, the offset disposition of via portion 32 results in less of an impact of the total volume of the metallization (e.g., copper) over the interconnect via 12a. Second, any additional stresses introduced over interconnect via 12a due to thermal expansion mismatch is reduced, since most of the volume of via portion 32 is located over inter level dielectric (ILD) material. Third, the offset relationship between the two vias will ensure that the liners thereof will connect. Thus, the structure will function even if a stress void is generated under via portion 32.

Thus configured, the interconnect test structure 30 provides an additional wire-out location for the upper metallization line 14. As a result, the resistivity of the upper metallization line 14 may be tested independently of, for example, interconnect via 12a, and vice versa. By placing one of each of the force and sensing probes 22a, 24a on lower metallization line 16 and the other of the force and sensing probes 22b, 24b on line portion 34 (in FIG. 2), it can be seen that the resistivity of interconnect via 12a may be measured independently, thereby locating any electromigration voids present therein. In the example depicted, such a testing configuration would allow for the isolated detection of first void 18.

Figure 4:
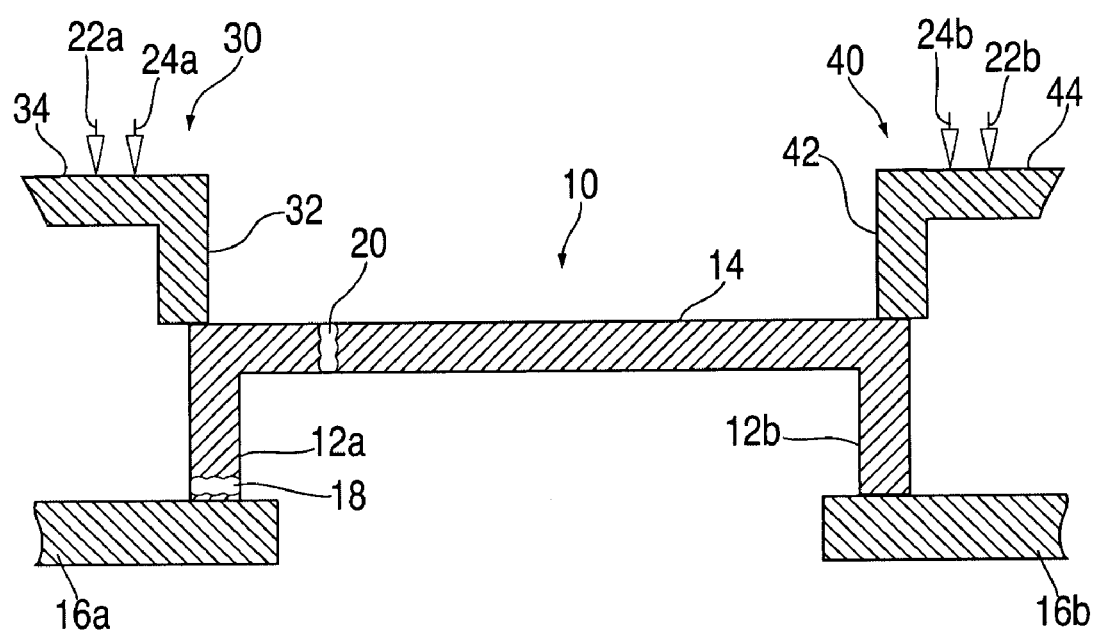
FIG. 4 is a cross-sectional view of an additional interconnect structure added to the structure of FIG. 2, in accordance with an alternative embodiment of the invention.

In another embodiment, an additional interconnect test structure 40 may be provided at the opposite end of upper metallization line, as shown in FIG. 4. As with interconnect test structure 30, the additional interconnect test structure 40 includes a via portion 42 disposed above interconnect via 12b, and is maintained in direct (and electrical) contact with a portion of the upper metallization line 34 overlying the top of interconnect via 12b. Interconnect structure 40 also includes line portion 44. Naturally, the additional interconnect test structure 40 allows for isolated electromigration testing of interconnect via 12b in a manner similar to the testing of interconnect via 12a. In addition, the upper metallization line 14 may be isolated from interconnect vias 12a and 12b for electroinigration testing and the detection of second void 20. Force probe 22a and sense probe 24a would contact line portion 34, while force probe 22b and sense probe 24b would contact line portion 44.

Through the use of the above described test structure embodiments, the different failure mechanisms as between via voiding and line voiding may be determined by isolating the locations of the voids themselves. The line portions of each interconnect test structure are used as additional wire outs for the four-point probe structures. Accordingly, individual vias may be singled out for electromigration testing, as well as the metallization line in between vias. Once again, the offset nature of the via portions of the test structures reduces the total volume of conductive fill (e.g., copper) over the interconnect vias, as well as reduces the mechanical stress thereupon in view of thermal expansion mismatch. Furthermore, the offset between the two vias will ensure the contact between the conductive liners of the two vias.

It should also be pointed out that although the test structure embodiments described herein provide additional wire out locations, vias and metallization lines for electromigration testing purposes, it is not necessarily intended for these structures to increase the overall number of signal communication pathways formed within the integrated circuit device. By the same token, however, it is contemplated that such a testing structure could be adapted for an alternative or an additional use than originally intended, such as a redundant communication pathway.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A test structure for locating electromigration voids in a semiconductor interconnect structure having an interconnect via interconnecting a lower metallization line with an upper metallization line, the test structure comprising:
   a via portion, said via portion overlying the top of the interconnect via, at the upper metallization line; and
   a line portion extending from said via portion;
   wherein said line portion connects to an external probing surface, in addition to a probing surface on the lower metallization line, thereby allowing the differentiation between the location of any electromigration voids present in the interconnect via and the location of any electromigration voids present in the upper metallization line.

2. The test structure of claim 1, wherein said via portion overlaps the interconnect via.

3. The test structure of claim 1, wherein said via portion is centered over a top corner of the interconnect via.

4. The test structure of claim 1, wherein the semiconductor interconnect structure is a dual damascene structure.

5. The interconnect structure of claim 1, wherein said first via portion is in direct contact with a first portion of said upper metallization line overlying the top of said first interconnect via.

6. A semiconductor interconnect structure, comprising:
   a pair of lower metallization lines, connected by an upper metallization line through a pair of interconnect vias; and
   a first test structure for locating electromigration voids in said upper metallization line and a first of said pair of interconnect vias, said first test structure further comprising:
      a first via portion, said first via portion overlying the top of said first interconnect via, at said upper metallization line; and a first line portion extending from said first via portion;

wherein first said line portion connects to a first external probing surface, in addition to a probing surface on a first of said pair of lower metallization lines, thereby allowing the differentiation between the location of any electromigration voids present in said first interconnect via and the location of any electromigration voids present in said upper metallization line.

7. The interconnect structure of claim 6, wherein said first via portion overlaps said first interconnect via.

8. The interconnect structure of claim 6, wherein said first via portion is centered over a top corner of said first interconnect via.

9. The interconnect structure of claim 6, further comprising:

a second test structure for locating electromigration voids in said upper metallization line and a second of said pair of interconnect vias, said second test structure further comprising:

a second via portion, said second via portion overlying the top of said second interconnect via, at said upper metallization line; and a second line portion extending from said second via portion;

wherein second said line portion connects to a second external probing surface, in addition to a probing surface on a second of said pair of lower metallization lines, thereby allowing the differentiation between the location of any electromigration voids present in said second interconnect via and the location of any electromigration voids present in said upper metallization line.

10. The interconnect structure of claim 9, wherein said second via portion is in direct contact with a second portion of said upper metallization line overlying the top of said second interconnect via.

11. The interconnect structure of claim 6, wherein said first via portion is in direct contact with a first portion of said upper metallization line overlying the top of said first interconnect via.

* * * * *